(12) United States Patent
Chen et al.

(10) Patent No.: US 10,790,009 B1
(45) Date of Patent: Sep. 29, 2020

(54) SENSING A MEMORY DEVICE

(71) Applicant: Macronix International Co., Ltd., Hsinchu (TW)

(72) Inventors: Chung-Kuang Chen, Hsinchu (TW); Han-Sung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 16/552,153

(22) Filed: Aug. 27, 2019

(51) Int. Cl.
*G11C 7/12* (2006.01)
*G11C 11/4091* (2006.01)
*G11C 7/10* (2006.01)
*G11C 11/4074* (2006.01)
*G11C 11/4094* (2006.01)

(52) U.S. Cl.
CPC ........ *G11C 11/4091* (2013.01); *G11C 7/1048* (2013.01); *G11C 11/4074* (2013.01); *G11C 11/4094* (2013.01)

(58) Field of Classification Search
CPC ... G11C 11/4091; G11C 7/12; G11C 11/4076; G11C 8/08; G11C 11/2273; G11C 7/065; G11C 16/0483; G11C 7/1006; G11C 7/22; G11C 16/26; G11C 16/10; G11C 11/419; G11C 16/08; G11C 16/32
See application file for complete search history.

(56) References Cited

U.S. PATENT DOCUMENTS

2006/0004955 A1* 1/2006 Ware ................... G06F 13/1605
711/106
2015/0340086 A1* 11/2015 Filipiak ................ G11C 29/028
365/185.03
2019/0355411 A1* 11/2019 Subramanian ...... G06F 13/1673

\* cited by examiner

*Primary Examiner* — Hien N Nguyen
(74) *Attorney, Agent, or Firm* — Fish & Richardson P.C.

(57) ABSTRACT

A memory device comprises a memory cell array, a plurality of sense amplifiers and a memory controller for controlling the plurality of sense amplifiers. The memory cell array includes a plurality of bit lines, where a bit line is coupled to a plurality of memory cells. A sense amplifier is coupled to a bit line and provides a sensing current to access data from one or more memory cells of the plurality of memory cells corresponding to the bit line. The memory controller performs operations comprising: during a pre-charging stage of a memory access cycle, providing, to a particular sense amplifier, a first voltage; and during a sensing stage of the memory access cycle, providing, to the particular sense amplifier, a second voltage, where the second voltage is a non-zero voltage that is lower than the first voltage.

20 Claims, 10 Drawing Sheets

SENSING A MEMORY DEVICE

TECHNICAL FIELD

This disclosure is directed towards a memory device, and in particular, to sensing memory cells in a memory device.

BACKGROUND

Memory cells can be sensed by applying a set of voltages during a sensing cycle. To sense data from a high-density memory device, e.g., a high-density NAND or NOR flash memory device having multiple-level cells, different voltage levels can be applied to the high-density memory device at different timings for suitable time periods.

SUMMARY

The present disclosure describes devices, techniques and systems directed towards sensing data from memory cells in a memory device. In some implementations, the memory device includes a memory cell array in which a plurality of metal bit lines (MBLs) are coupled to the memory cells arranged in cell strings, with each metal bit line (MBL) being coupled to one or more cell strings. A plurality of sense amplifiers are each connected to a metal bit line in the memory device. When data is accessed from a memory cell, e.g., during a program verify operation, a memory controller of the memory device controls a sense amplifier, connected to the metal bit line coupled to the cell string with the target memory cell, to provide a sensing current to the target memory cell. In some implementations, the metal bit line has a parasitic capacitance, and a cross-coupling capacitance due to a coupling effect with one or more adjacent metal bit lines (together, referred to as "capacitance unit" of the metal bit line). A first portion of the sensing current from the sense amplifier is provided as cell current to the cell string with the target memory cell; while a second portion and a third portion of the sensing current are provided, respectively, to the parasitic capacitance and the cross-coupling capacitance, with the second and third portions combined referred to as channel current for the capacitance unit. A voltage difference at an output node of the sense amplifier coupled to the metal bit line, during a transition from a pre-charging operation to a sensing operation can cause channel current, such that the amount of sensing current is not adequate for accurate sensing operations. To maintain an adequate sensing current, the memory controller initiates data access from the target memory cell by providing a first voltage to the sense amplifier to bias the metal bit line to a certain voltage level, which pre-charges the capacitance unit of the metal bit line using a pre-charging current. By pre-charging the capacitance unit, the channel current is reduced or eliminated while most of the sensing current is provided as the cell current during the subsequent sensing operation of the target memory cell.

When performing the sensing operation, the memory controller provides a second voltage to the sense amplifier, which eliminates a variation in the bias of the metal bit line, or limits the variation in the bias of the metal bit line within a known range of the certain voltage level. By eliminating or limiting the variation in the bias of the metal bit line, an increase to the channel current is prevented, which prevents an increase in the cross-coupling capacitance of the metal bit line with a neighboring metal bit line. In doing so, any increase in the channel current of the neighboring metal bit line due to the cross-coupling capacitance is also prevented, such that most of the sensing current for a memory access for the neighboring metal bit line is provided as cell current. This prevents increase in sensing noise for the neighboring metal bit line, improving the sensing accuracy for a memory cell coupled to the neighboring metal bit line. The disclosed techniques and systems accordingly avoid a shift in a threshold voltage of a memory cell coupled to the neighboring metal bit line due a program verify operation of the target memory cell.

In this manner, changes to the memory array pattern, e.g., due to programming of one or more memory cells in the array, do not cause changes in the threshold voltage of other memory cells in the array, where threshold voltage shifts could lead to inaccurate reading of the contents of the memory cells. This is useful to implement faster or high-density memory devices, such as memory devices with triple-level cells (TLC) or quad-level cells (QLC), among others, and particularly for lower reference sensing current.

In general, one innovative aspect of the subject matter described in this specification can be implemented in a memory device comprising a memory cell array, a plurality of sense amplifiers and a memory controller for controlling the plurality of sense amplifiers. The memory cell array includes a plurality of bit lines, where a bit line is coupled to a plurality of memory cells. A sense amplifier is coupled to a bit line and provides a sensing current to access data from one or more memory cells of the plurality of memory cells corresponding to the bit line. The memory controller performs operations comprising: during a pre-charging stage of a memory access cycle, providing, to a particular sense amplifier, a first voltage; and during a sensing stage of the memory access cycle, providing, to the particular sense amplifier, a second voltage, where the second voltage is a non-zero voltage that is lower than the first voltage.

The foregoing and other implementations can each optionally include one or more of the following features, alone or in combination. The first voltage may drive the sensing current to access data from a target memory cell. The sensing current may include (i) a first current provided to a plurality of memory cells coupled to a particular bit line that includes the target memory cell, and (ii) a second current provided to a capacitance circuit corresponding to the particular bit line. The particular sense amplifier may include a sensing unit that generates the first current based on a first control signal received from the memory controller, and a pre-charging unit that generates the second current based on a second control signal and a third control signal that are received from the memory controller.

The sensing unit may include a first transistor that provides the first voltage upon application of the first control signal to a gate of the first transistor, and provides the second voltage upon application of a fourth control signal to the gate of the first transistor. The sensing unit may include a first transistor that provides the first voltage upon application of the first control signal to a gate of the first transistor, and a second transistor that provides the second voltage upon application of a fourth control signal to a gate of the second transistor.

The pre-charging unit may include a first transistor that provides a third voltage upon application of the second control signal to a gate of the first transistor, and a second transistor that provides a fourth voltage upon application of the third control signal to a gate of the second transistor, where the second current is generated using the third voltage and the fourth voltage.

The capacitance circuit may include a parasitic capacitance of the particular bit line and a cross-coupling capacitance shared between the particular bit line and an adjacent bit line.

The particular sense amplifier may provide the sensing current to a plurality of memory cells coupled to a particular bit line during a memory access cycle. The memory controller may provide the first voltage to the particular sense amplifier to bias the particular bit line to a known voltage level during the pre-charging stage, and may provide the second voltage to the particular sense amplifier to limit a variation in the bias of the particular bit line within a known voltage range during the sensing stage. A value of the second voltage may be selected to maintain the bias of a particular bit line coupled to the particular sense amplifier at a known voltage level.

In another general aspect, a method for sensing a memory device comprises: providing, by a memory controller to a particular sense amplifier of a plurality of sense amplifiers included in the memory device, a first voltage during a pre-charging stage of a memory access cycle, where a sense amplifier of the plurality of sense amplifiers is coupled to a bit line of a plurality of bit lines included in the memory device and provides a sensing current to access data from one or more memory cells corresponding to the bit line. The method further comprises providing, by the memory controller to the particular sense amplifier, a second voltage during a sensing stage of the memory access cycle, where the second voltage is a non-zero voltage that is lower than the first voltage.

The foregoing and other implementations can each optionally include one or more of the following features, alone or in combination. Providing the first voltage to the particular sense amplifier may comprise driving the sensing current to access data from a target memory cell. The sensing current may include (i) a first current provided to a plurality of memory cells coupled to a particular bit line that includes the target memory cell, and (ii) a second current provided to a capacitance circuit corresponding to the particular bit line.

The method may further comprise: generating, using a sensing unit included in the particular sense amplifier, the first current based on a first control signal received from the memory controller; and generating, using a pre-charging unit included in the particular sense amplifier, the second current based on a second control signal and a third control signal that are received from the memory controller.

The method may further comprise: providing, using a first transistor included in the sensing unit, the first voltage upon application of the first control signal to a gate of the first transistor, and the second voltage upon application of a fourth control signal to the gate of the first transistor.

The method may further comprise: providing, using a first transistor included in the sensing unit, the first voltage upon application of the first control signal to a gate of the first transistor; and providing, using a second transistor included in the sensing unit, second voltage upon application of a fourth control signal to a gate of the second transistor.

The method may further comprise: providing, using a first transistor included in the pre-charging unit, a third voltage upon application of the second control signal to a gate of the first transistor; and providing, using a second transistor included in the pre-charging unit, a fourth voltage upon application of the third control signal to a gate of the second transistor, where the second current is generated using the third voltage and the fourth voltage.

The second current may be provided to a parasitic capacitance of the particular bit line and a cross-coupling capacitance shared between the particular bit line and an adjacent bit line, where the parasitic capacitance and the cross-coupling capacitance are included in the capacitance circuit.

The particular sense amplifier may provide the sensing current to a plurality of memory cells coupled to a particular bit line during a memory access cycle. The method may comprise providing, by the memory controller: the first voltage to the particular sense amplifier to bias the particular bit line to a known voltage level during the pre-charging stage, and the second voltage to the particular sense amplifier to limit a variation in the bias of the particular bit line within a known voltage range during the sensing stage. Providing the second voltage may comprise selecting a value of the second voltage to maintain the bias of a particular bit line coupled to the particular sense amplifier at a known voltage level.

Implementations of the above techniques include systems and computer program products. One such system includes one or more processors and one or more non-transitory machine-readable media storing instructions that, when executed by the one or more processors, are configured to cause the one or more processors to perform the above-described actions. One such computer program product is suitably embodied in one or more non-transitory machine-readable media storing instructions that, when executed by one or more processors, are configured to cause the one or more processors to perform the above-described actions.

The details of one or more examples of the subject matter described in this specification are set forth in the accompanying drawings and the description below. Other potential features, aspects, and advantages of the subject matter will become apparent from the description, the drawings, and the claim.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1:
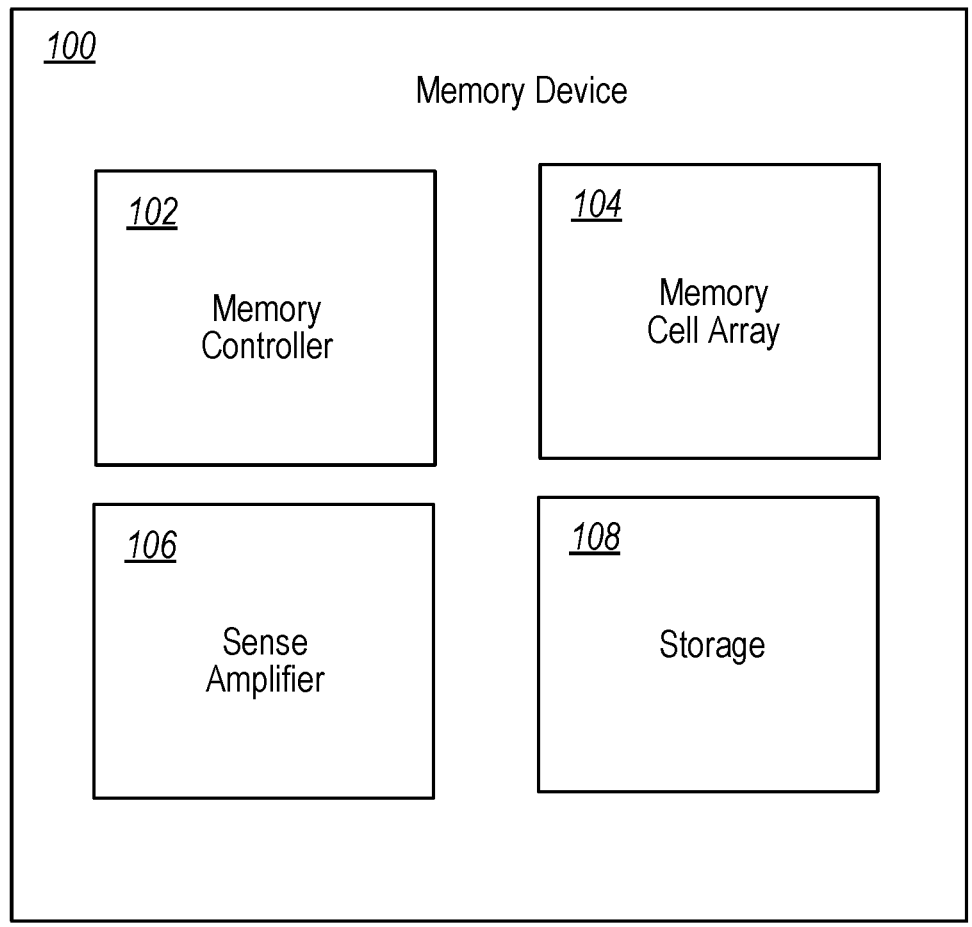
FIG. 1 illustrates an example of a memory device that avoids threshold voltage shifts of memory cells of a memory cell array due to changes in the array pattern of the memory cell array.

FIG. 1 illustrates an example of a memory device that avoids threshold voltage shifts of memory cells of a memory cell array 104 due to changes in the array pattern of the memory cell array. The memory device 100 includes a memory controller 102, the memory cell array 104, and one or more sense amplifiers that are collectively referred to as sense amplifier 106.

The memory controller 102 includes logic to perform various operations, which include accessing the memory cell array 104, e.g., writing to, reading from, or erasing from the memory cell array 104. In some implementations, the memory controller 102 includes one or more processors that execute the operations to access the memory cell array 104. In some implementations, the memory controller 102 accesses the memory cell array 104 by controlling the sense amplifier 106 to sense memory cells in the memory cell array 104. In some implementations, the logic for the operations are stored in a storage coupled to the memory device, e.g., storage 108.

In some implementations, the memory cell array 104 includes one or more memory blocks. Each memory block includes one or more columns, called cell strings, of memory cells. A cell string can include a plurality of memory cells. The memory cells can be single-level cells (SLCs), or multi-level cells (MLCs), such as TLCs or QLCs. In some implementations, the memory cell array 104 includes nonvolatile memory, e.g., flash memory cells. For example, the nonvolatile memory can include two-dimensional (2D) NAND flash memory cells, three-dimensional (3D) NAND flash memory cells comprising U-shaped strings, 3D NAND flash memory cells comprising non-U-shaped strings, or NOR flash cells, among other suitable types of nonvolatile memory. In some implementations, each memory block includes a single string.

The sense amplifier 106 provides sensing current to one or more memory cells in the memory cell array 104 and performs operations, e.g., pre-charging or sensing operations, for the memory cell array 104. The sense amplifier 106 provides sensing current to the memory cell array 104 at a particular current level. For example, the sense amplifier 106 can perform drain side bias of a memory cell and provide a cell current that flows from the sense amplifier through a memory cell string to a common source line (CSL) or ground (GND.) In some implementations, the storage 108 stores data indicating what threshold voltage is provided, instructions for logical operations to indicate the threshold voltage of array cells, or data after sensing, or any combination of these.

In some implementations, the memory controller 102 controls the memory cell access operations performed by the sense amplifier 106. For example, the memory controller 102 can provide bias voltage levels to the sense amplifier 106 to generate sensing current at a particular current level at a particular timing using control signals. Such access operations performed by the sense amplifier 106 are described in greater detail with reference to FIGS. 2 to 6 below.

Figure 2:
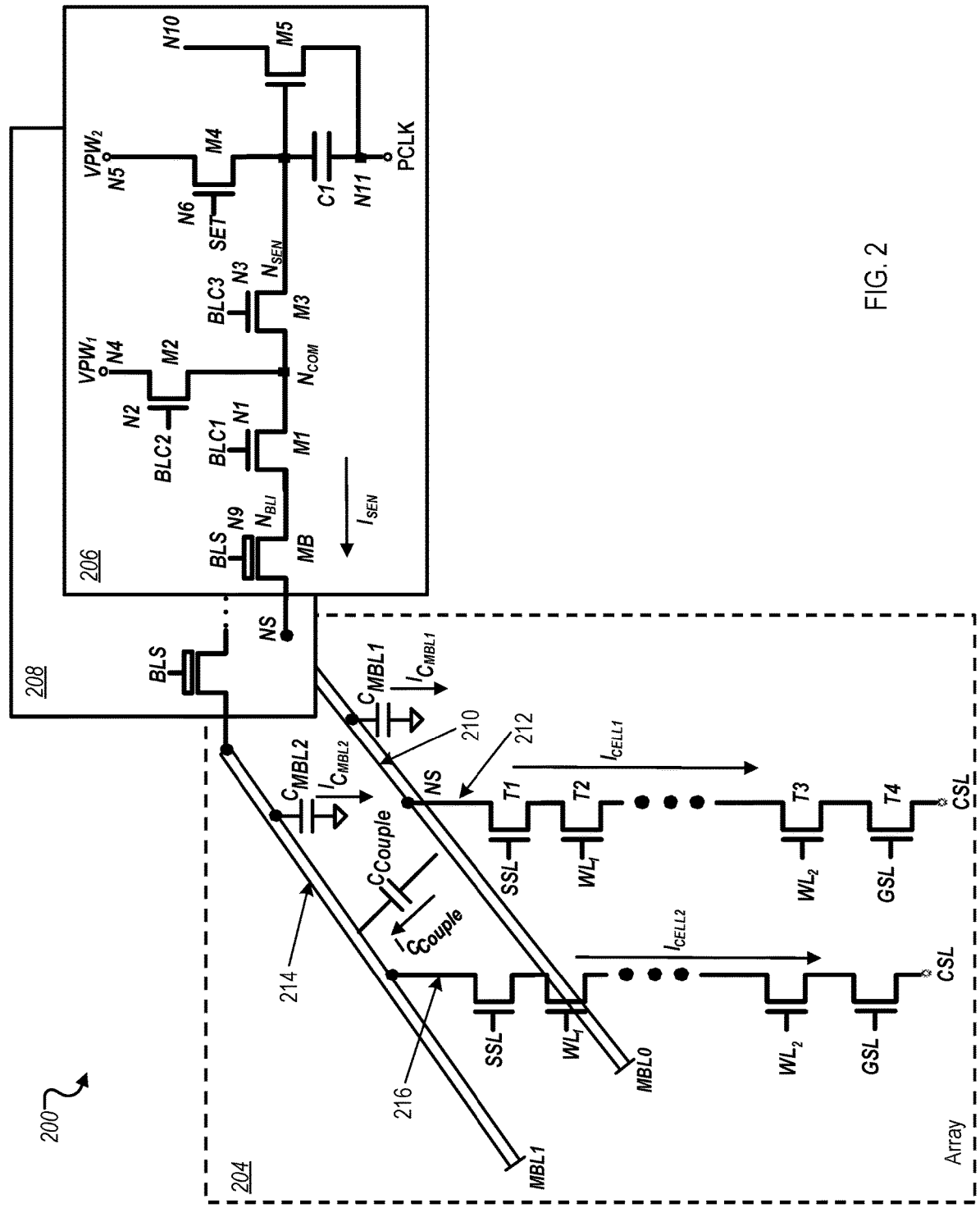
FIG. 2 illustrates an example of a circuit for a memory cell array and sense amplifiers coupled to the memory cell array.

FIG. 2 illustrates an example of a circuit 200 for a memory cell array 204 and sense amplifiers 206 and 208 coupled to the memory cell array. In some implementations, the circuit 200 corresponds to a portion of the memory device 100, with the memory cell array 204 and the sense amplifiers 206 and 208 representing components of the memory device 100. For example, in some cases, the memory cell array 204 corresponds to the memory cell array 104, while the sense amplifiers 206 and 208 correspond to the one or more sense amplifiers represented by sense amplifier 106. The memory cell array 204 includes a plurality of metal bit lines, of which two metal bit lines, metal bit lines MBL0 210 and MBL1 214, are illustrated in FIG. 2. The memory cell array further includes a plurality of cell strings, each having one or more memory cells, such as cell string 212 coupled to metal bit line 210 and cell string 216 coupled to metal bit line 214. Although only two sense amplifiers 206 and 208 are shown, in some implementations, there are a plurality of sense amplifiers, with each sense amplifier being coupled to a different metal bit line and corresponding cell string(s). For example, sense amplifier 206 is coupled to the memory cell string 212 through the metal bit line 210 at node NS, while sense amplifier 208 is coupled to the memory cell string 216 through the metal bit line 214.

In some implementations, parasitic capacitances $C_{MBL1}$ and $C_{MBL2}$ are associated with respective metal bit lines 210 and 214. Additionally, a cross-coupling capacitance $C_{Couple}$ is associated with the metal bit lines 210 and 214 due to a cross-coupling effect between the metal bit lines 210 and 214. The sense amplifier 206 provides a sensing current $I_{SEN}$ for accessing a memory cell in the cell string 212 by biasing the metal bit line 210, e.g., by setting a bias of the node NS. The sensing current is provided to the cell string 212, or to the capacitances associated with the metal bit line 210, or both. In the illustrative example of FIG. 2, cell current $I_{CELL1}$ represents current provided to the memory cell string 212, current $I_{CMBL1}$ represents current provided to the parasitic capacitance $C_{MBL1}$ of the metal bit line 210, while current $I_{CCouple}$ represents the current provided to the cross-coupling capacitance $C_{Couple}$ between the metal bit lines 210 and 214. In some cases, the parasitic capacitance $C_{MBL1}$ and the cross-coupling capacitance $C_{Couple}$ are together referred to as the capacitance unit of the metal bit line 210, and the combination of the current $I_{CMBL1}$ and the current $I_{CCouple}$ is referred to as the charging current $I_{CH}$ for the capacitance unit. That is, the sensing current $I_{SEN}$ can be represented as a sum of the cell current $I_{CELL}$ and the charging current $I_{CH}$ as shown in equation (1):

$$I_{SEN}=I_{CELL}+(I_{CMBL1}+I_{CCouple})=I_{CELL}+I_{CH} \quad (1)$$

The cell string 212 includes a plurality of memory cells, which are realized using multiple transistors, e.g., transistors T1, T2, T3 and T4. The transistors can be of various types including, but not limited to, a bipolar junction transistor, a p-channel Metal Oxide Semiconductor (PMOS) transistor, an n-channel Metal Oxide Semiconductor (NMOS) transistor, a complementary Metal Oxide Semiconductor (CMOS) transistor, or other suitable types of transistors.

As shown in FIG. 2, the transistors T1, T2, T3 and T4 in the cell string 212 are coupled between the sense node NS and the common source line CSL. The drain of the transistor T1 is coupled to the node NS, the gate of the transistor T1 is coupled to a string select line SSL, and the source of the transistor T1 is coupled to the transistor T2. The transistor T1 is turned on or off based on a voltage provided through the string select line SSL. For example, when a voltage over a threshold voltage of the transistor T1 is provided to the gate of the transistor T1 through the string select line SSL, the transistor T1 is turned on so that current flows from the node NS to the transistor T2.

The drain of the transistor T2 is coupled to the source of the transistor T1, the gate of the transistor T2 is coupled to a word line WL1, and the source of the transistor T2 is coupled to the transistor T3. The transistor T2 is turned on or off based on a voltage provided through the word line WL1. For example, when a voltage over a threshold voltage of the transistor T2 is provided to the gate of the transistor T2 through the word line WL1, the transistor T2 is turned on so that current flows from the transistor T1 to the transistor T3 through the transistor T2.

The drain of the transistor T3 is coupled to the source of the transistor T2, the gate of the transistor T3 is coupled to a word line WL2, and the source of the transistor T3 is coupled to the transistor T4. The transistor T3 is turned on or off based on a voltage provided through the word line WL2. For example, when a voltage over a threshold voltage of the transistor T3 is provided to the gate of the transistor T3 through the word line WL2, the transistor T3 is turned on so that current flows from the transistor T2 to the transistor T4 through the transistor T3.

The drain of the transistor T4 is coupled to the source of the transistor T3, the gate of the transistor T4 is coupled to a global source line GSL, and the source of the transistor T4 is coupled to the common source line CSL. The transistor T4 is turned on or off based on a voltage provided through global source line GSL. For example, when a voltage over a threshold voltage of the transistor T4 is provided to the gate of the transistor T4 through the global source line GSL, the transistor T4 is turned on so that current flows from the transistor T3 to the common source line CSL through the transistor T4.

In some implementations, one or more additional transistors can be coupled between the source of the transistor T2 and the drain of the transistor T3. In these implementations, the gate of each transistor can be respectively coupled to a word line that is coupled to one or more memory cells.

Cell strings coupled to other metal bit lines, e.g., cell string 216 coupled to metal bit line 214, are configured in a manner similar to that discussed in these sections for cell string 212. The operations for accessing data from memory cells in these cell strings are also similar to those described with respect to accessing data from memory cells in the cell string 212.

The sense amplifier 206 provides a sensing current to the metal bit line 210 and cell string 212 based on one or more control signals provided by a memory controller, e.g., the memory controller 102. In some implementations, the sense amplifier 206 includes multiple transistors, which can be of various types, such as a bipolar junction transistor, a PMOS transistor, an NMOS transistor, a CMOS transistor, or other suitable types of transistors. For example, as shown in FIG. 2, the sense amplifier 206 includes transistors M1, M2, M3, MB, and M4. A node N4 is coupled to the drain of the transistor M2, a node N2 is coupled to the gate of the transistor M2, and a node $N_{COM}$ is coupled to the source of the transistor M2. In this example, a voltage VPW1 is provided to the node N4 and a bit line clamping signal BLC2 is provided to the node N2. When the bit line clamping signal BLC2 satisfies a threshold voltage of the transistor M2, the transistor M2 is turned on such that the voltage VPW1 is provided to the node $N_{COM}$. In some implementations, the voltage VPW1 can be used to pre-charge the cell string 212. In particular, the voltage VPW1 can be used to pre-charge the parasitic capacitance $C_{MBL1}$ of the metal bit line 210.

A node N5 is coupled to the drain of the transistor M4, a node N6 is coupled to the gate of the transistor M4, and a node $N_{SEN}$ is coupled to the source of the transistor M4. In this example, a voltage VPW2 is provided to the node N5 and a setting signal SET is provided to the node N6. Where the setting signal SET satisfies a threshold voltage of the transistor M4, the transistor M4 is turned on such that the voltage VPW2 is provided to the node $N_{SEN}$. In some implementations, the voltage VPW2 can be used to perform sensing operations for the cell string 212. In particular, the voltage VPW2 can be provided to the metal bit line 210 and cell string 212 of the memory cell array 204.

The node $N_{SEN}$ is coupled to the drain of the transistor M3, a node N3 is coupled to the gate of the transistor M3, and a node $N_{COM}$ is coupled to the source of the transistor M3. In this example, a bit line clamping signal BLC3 is provided to the node N3. Where the bit line clamping signal BLC3 satisfies a threshold voltage of the transistor M3, the transistor M3 is turned on such that the voltage at the node $N_{SEN}$ is provided to the node $N_{COM}$ through the transistor M3.

The node $N_{COM}$ is coupled to the drain of the transistor M1, a node N1 is coupled to the gate of the transistor M1, and a node $N_{BLI}$ is coupled to the source of the transistor M1. In this example, a bit line clamping signal BLC1 is provided to the node N1. Where the bit line clamping signal BLC1 satisfies a threshold voltage of the transistor M1, the transistor M1 is turned on such that the voltage at the node $N_{COM}$ is provided to the node $N_{BLI}$.

The node $N_{BLI}$ is coupled to the drain of the transistor MB, a node N9 is coupled to the gate of the transistor MB, and the node NS is coupled to the source of the transistor MB. In this example, a bit line select signal BLS is provided to the node N9. Where the signal BLS satisfies a threshold voltage of the transistor MB, the transistor MB is turned on such that the voltage at the node $N_{BLI}$ is provided to the node NS to bias the metal bit line 210.

In some implementations, the sense amplifier 206 further includes a transistor M5. A node N10 is coupled to the drain of the transistor M5, the node $N_{SEN}$ is coupled to the gate of the transistor M5, and a node N11 is coupled to the source of the transistor M5. The node N10 can be coupled to a latch unit of a memory device, e.g., the memory device 100 of FIG. 1. Where voltage at the node $N_{SEN}$ satisfies a threshold voltage of the transistor M5, the transistor M5 is turned on such that voltage at the node N10 can be provided to the node N11 through the transistor M5. In some implementations, a clock pulse PCLK is provided at the node N11. In some implementations, the sense amplifier 206 further includes a capacitor C1, which is coupled between the node $N_{SEN}$ and the node N11.

Other sense amplifiers in the memory device that are coupled to other metal bit lines, sense amplifier 208 coupled to metal bit line 214, are configured in a manner similar to that discussed with respect to sense amplifier 206. The operations of these other sense amplifiers are also similar to the operations described with respect to sense amplifier 206.

For conventional memory devices, the threshold voltage (Vth) of a memory cell can be shifted by changes in the array pattern of the memory array during program operations. For example, as described in greater detail with reference to FIGS. 3A-3C below, the Vth of a memory cell can be shifted higher due to the application of program pulses for program/verify cycles during a program operation. The shift in the memory cell Vth will change the $I_{CELL}$ of the memory cell, causing a change in the sense node bias of the sense amplifier, resulting in a change in the bias of the coupled metal bit line. The change in the metal bit line bias will affect the cross-coupling capacitance of the metal bit line with a neighboring metal bit line, changing the $I_{CCouple}$ of the neighboring metal bit line. Since sensing current $I_{SEN}$ depends on $I_{CCouple}$ as shown by equation (1), the change in $I_{CCouple}$ will change $I_{SEN}$ for the sense amplifier coupled to the neighboring metal bit line, leading to an increase in the Vth of memory cells coupled to the neighboring metal bit line. Accordingly, accessing data in the memory cells coupled to the neighboring metal bit line can have inaccurate readings. As described in in greater detail with reference to FIGS. 4A-4B, 5A-5B and 6 below, the techniques described in this disclosure enable the sense amplifier 206 to perform program verify operations for the memory cell array 204 using the sensing current $I_{SEN}$ in a manner that prevents variations in the bias of the metal bit line 210, such that the Vth of memory cells in the memory array 204 are not shifted due to program operations.

Figure 3A:
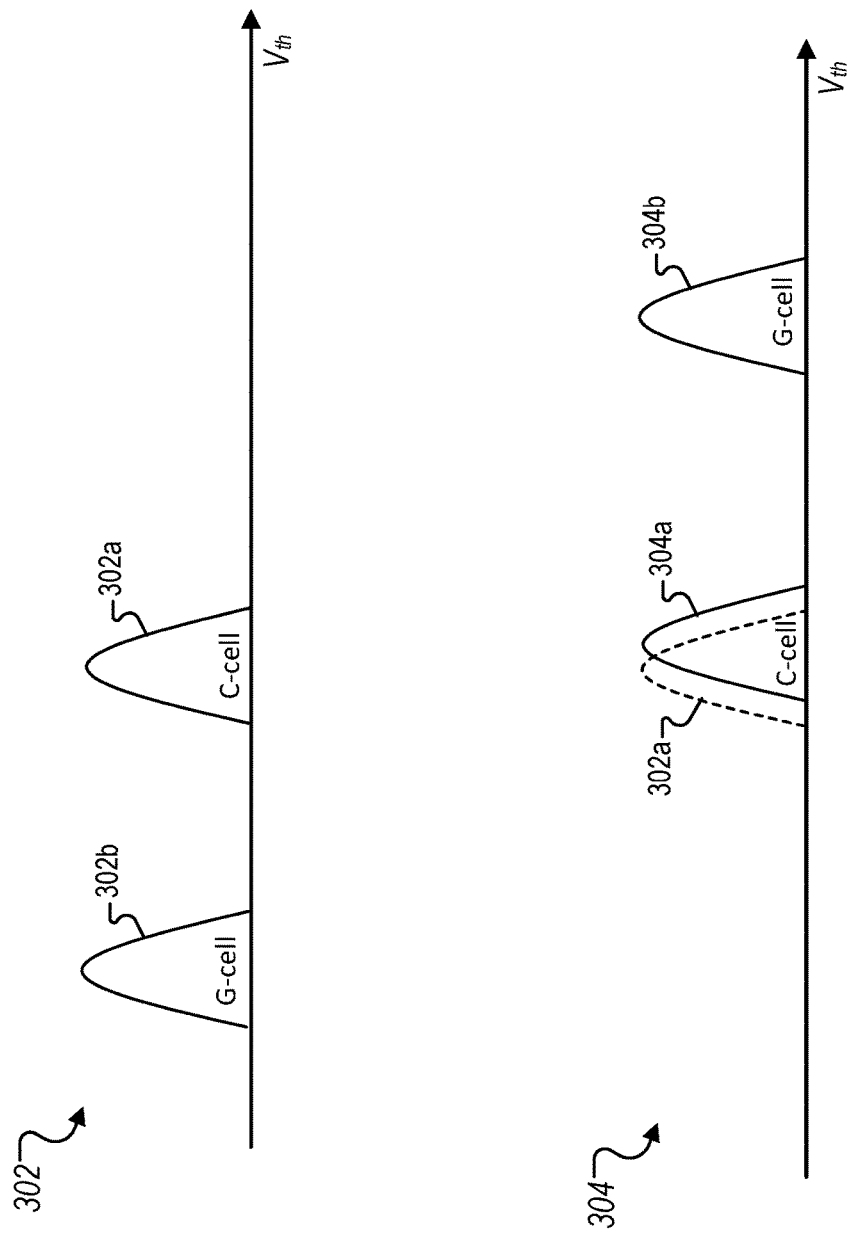
FIGS. 3A-3C illustrate sensed threshold voltage shift of memory cells due to change in the array pattern of a memory cell array during program operations in a conventional memory device.
Figure 3B:
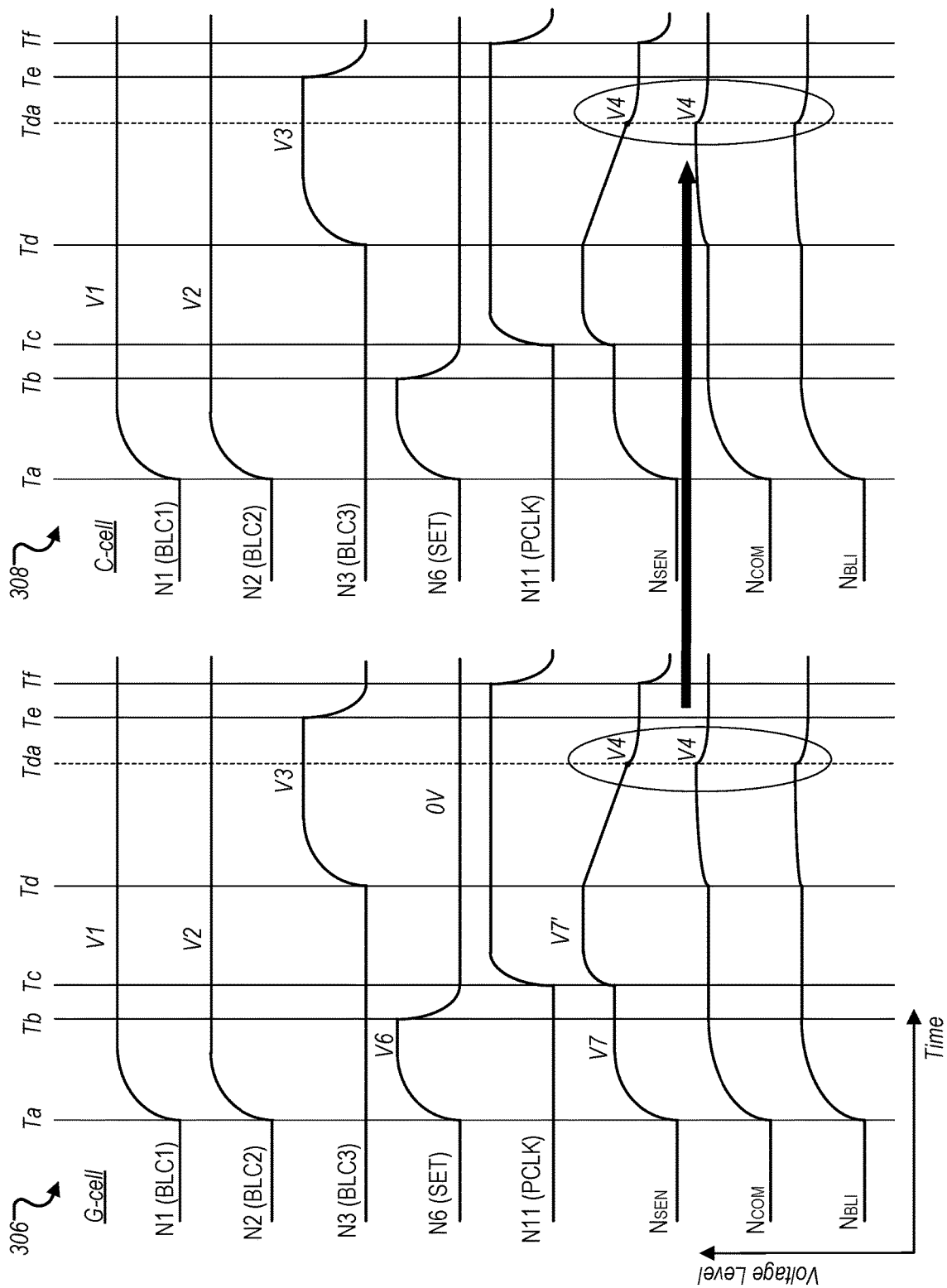
Figure 3C:
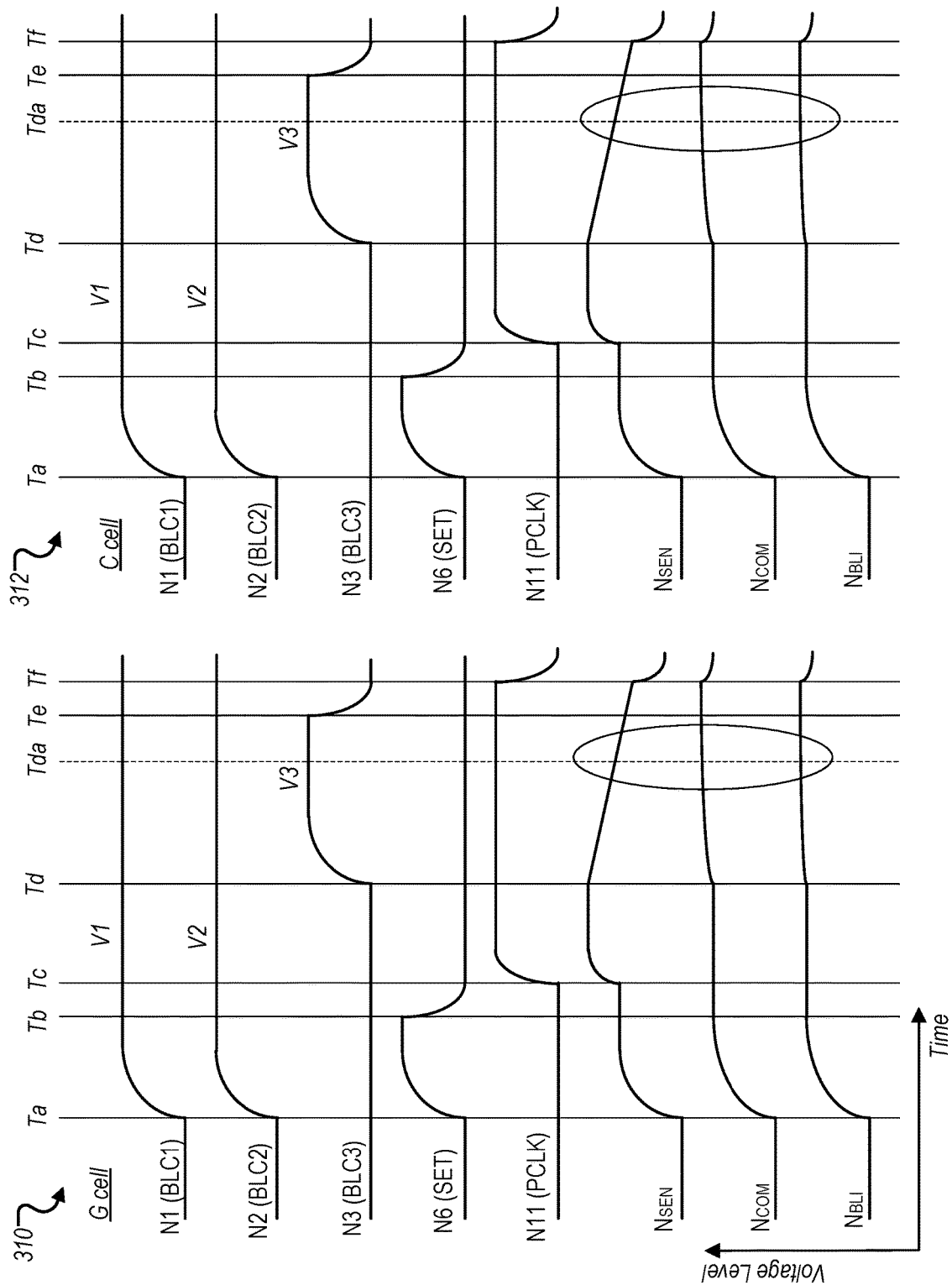

FIGS. 3A-3C illustrate sensed threshold voltage shift of memory cells due to change in the array pattern of a memory cell array during program operations in a conventional memory device. As shown in the figures, for one kind of array pattern, the neighboring cells of C-cells are referred to as G-cells. FIG. 3A shows the sensed threshold voltages (Vth) 302a and 302b of neighboring memory cells C-cells and G-cells, respectively, at a time 302 during a program operation of memory cell G-cells, and sensed threshold voltages 304a and 304b of memory cells C-cells and G-cells, respectively, at a time 304 after the program operation. The memory cells C-cells and G-cells are coupled to neighboring metal bit lines. At the time 302, memory cell C-cells have been programmed to a level with sensed Vth 302a, but memory cell G-cells have not passed programming verify operations. The sense amplifier corresponding to memory cell G-cells applies repeated program pulses, with successively increasing voltage levels, to program memory cell G-cells to its target voltage level. At time 304, memory cell G-cell has reached its target voltage level. However, the application of program pulses to memory cell G-cells during the iterative program verify cycles has shifted the sensed threshold voltage of memory cell G-cells to Vth 304b.

The change in Vth for memory cell G-cells changes the $I_{CELL}$ of the memory cell, which in turn changes the sense node bias of the sense amplifier coupled to the memory cell G-cells. The change in the sense node bias results in a change in the bias of the metal bit line coupled to the memory cell G-cells. The change in the bias of the metal bit line bias affects the cross-coupling capacitance $C_{Couple}$ between the metal bit line corresponding to memory cell G-cells, and the neighboring metal bit line corresponding to memory cell C-cells, changing the $I_{CCouple}$ of the neighboring metal bit line. The change in $I_{CCouple}$, results in a change in the sensing current $I_{SEN}$ for the sense amplifier coupled to the neighboring metal bit line, leading to an increase in the sensed threshold voltage of memory cell C-cells. For example, at time 304, the sensed threshold voltage of memory cell C-cells has shifted to sensed Vth 304a due to the program verify operation for memory cell G-cell.

FIG. 3B shows timing diagrams 306 and 308 for variations in voltage levels in the sense amplifiers coupled to memory cells G-cell and C-cell respectively, due to program verify cycles for memory cell G-cell during a program operation of memory cell G-cell. The timing diagrams described in this specification represent one access cycle to perform pre-charging and sensing operations for a memory cell. The access cycle can include multiple stages to perform pre-charging and sensing operations. The stages can be performed sequentially in the stated order. In the timing diagrams described in this specification, X-axis represents time and Y-axis represents voltage level. In each timing diagram, which corresponds to a sense amplifier and corresponding metal bit line, time Ta represents start of a pre-charge stage to pre-charge the metal bit line and set the sense node $N_{SEN}$; time Tb represents end to setting sense node $N_{SEN}$; time Tc represents start of boost up of sense node $N_{SEN}$; time Td represents start of sensing period; time Te represents end of sensing period; and time Tf represents boost down of sense node $N_{SEN}$.

As shown by the timing diagram 306 for the sense amplifier corresponding to memory cell G-cell, before time Ta, all nodes N1, N2, N3, N6, N11, $N_{SEN}$, $N_{COM}$ and $N_{BLI}$ for the sense amplifier (which are similar to the nodes described in FIG. 2) maintain respective default voltage levels. In some implementations, the default voltage levels for the nodes N1, N2, N3, N6, N11, $N_{SEN}$, $N_{COM}$ and $N_{BLI}$ are set to a same voltage level, e.g., 0 volts (V). In some other implementations, the default voltage levels for these nodes are set to different voltage levels.

The memory controller performs pre-charging operations between time Ta and time Td. Between time Ta and time Tb, the memory controller increases a voltage level of the bit line clamping signal BLC2 such that a voltage level at the node N2 increases. At the time Tb, the node N2 is charged to a voltage level V2. When the voltage level V2 is higher than the threshold voltage of the transistor M2, the transistor M2 is turned on such that the voltage VPW1 is provided from the node N4 to the node $N_{COM}$. Thus, a voltage level at the node $N_{COM}$ increases between the time Ta and the time Tb.

Between the time Ta and the time Tb, the memory controller increases a voltage level of the bit line clamping signal BLC1 such that a voltage level at the node N1 increases. At the time Tb, the node N1 is charged to a voltage level V1. When the voltage level V1 is higher than the threshold voltage of the transistor M1, the transistor M1 is turned on such that the voltage at the node $N_{COM}$ is provided to the node $N_{BLI}$. Thus, a voltage level at the node $N_{BLI}$ increases between the time Ta and the time Tb. In some implementations, voltage level V2≥voltage level V1.

Between the time Ta and the time Tb, the memory controller pre-charges the sense node $N_{SEN}$ by setting signal SET such that a voltage level at the node N6 increases. At the time Tb, the node N6 is charged to a voltage level V6. Where the voltage level V6 fully turns on the transistor M4, the voltage VPW2 is provided from the node N5 to the node $N_{SEN}$. Thus, a voltage level at the node $N_{SEN}$ increases between the time Ta and the time Tb to a voltage level V7, with $N_{SEN}$ being pre-charged through M4 during the time period between Ta and Tb.

Between the time Ta and the time Tb, the memory controller maintains respective default voltage levels at the nodes N3 and N11. When the default voltage level at the node N3 is lower than the threshold voltage of the transistor M3, the transistor M3 is turned off such that the voltage at the node $N_{SEN}$ is not provided at the node $N_{COM}$.

Between the time Tb and a time Tc, the memory controller decreases the voltage at the node N6 from the voltage level V6 to a default voltage level such that the capacitor C1 is fully charged, but not overcharged. In some cases, the voltage at node N6 is allowed to discharge to 0 volts (V). In some cases, the capacitor C1 is fully charged at the time Tc.

At the time Tc, the memory controller provides the clock signal PCLK to the node N11, and C1 is boosted by PCLK at the time Tc. Where a peak of the clock signal PCLK is at a high voltage level, the voltage at the node $N_{SEN}$ is increased from the voltage level V7 to a voltage level V7'. That is, the voltage difference between the node $N_{SEN}$ and the node N11 is maintained by the capacitor C1, the voltage at the node $N_{SEN}$ is increased as the voltage at the node N11 is increased by the clock signal PCLK.

The memory controller performs sensing operations between the time Td and a time Te. The memory controller starts sensing at time Td and stops sensing at time Te, and at time Tf boosts down the node $N_{SEN}$. At time Td, the node $N_{SEN}$ is charged to voltage level V7'. However, at the time Td, the voltage V7' is not yet provided to the coupled metal bit line because the memory controller has not turned on the transistor M3 by maintaining a default voltage level at the node N3 using the bit line clamping signal BLC3.

When the memory controller turns on the transistor MB using the bit line signal BLS, the voltage at node $N_{BLI}$ is provided to the metal bit line of the memory cell G-cell. In particular, the sensing current $I_{SEN}$ corresponding to the $N_{BLI}$ voltage is provided from the corresponding sense amplifier to the metal bit line. The sensing current $I_{SEN}$ provides the cell current $I_{CELL}$ for the memory cell G-cell, and the charging current $I_{CH}$ for the capacitance unit of the metal bit line. The cell current $I_{CELL}$ pre-charges the memory cell G-cell such that the memory cell is charged to a target pre-charging voltage level. The charging current $I_{CH}$ pre-charges the parasitic capacitance and the cross-coupling capacitance of the metal bit line to a target pre-charging voltage level.

Between time Td and time Te, the memory controller maintains the voltage at the node N2 at the voltage level V2, such that a voltage V2-Vgs(M2) is provided to the node $N_{COM}$ through the transistor M2, where Vgs(X) refers to the gate-to-source voltage of transistor X. Between the time Td and the time Te, the memory controller increases voltage at the node N3 to the voltage V3 using the bit line clamping signal BLC3. When the voltage at the node N3 becomes higher than the threshold voltage of the transistor M3, the transistor M3 is turned on such that the voltage V3-Vgs(M3) is provided to the node $N_{COM}$ by the transistor M3.

In some cases, voltage level V3>voltage level V2>voltage level V1. In such cases, V3-Vgs(M3)>V2-Vgs(M2), such that, when voltage V3 is provided to node N3 at time Td, the voltage level at node $N_{COM}$ becomes higher than the voltage at transistor M2. Accordingly, the transistor M2 is turned off, ceasing pre-charging of the metal bit line. The voltage at node $N_{SEN}$ is discharged through the transistors M3, M1 and MB and the metal bit line as sensing current $I_{SEN}$.

During the program operation, when the Vth of memory cell G-cell is below the target threshold voltage, the corresponding sense amplifier provides successive program pulses with increasing voltage levels during program verify cycles, to bring the Vth up to the target level. The successive program pulses changes the sense node bias for the sense amplifier, causing the bias of the metal bit line coupled to the memory cell G-cell to change, as described above. The change in the bias of the metal bit line changes the coupling effect with the neighboring metal bit line of memory cell C-cell, causing the sensing current for C-cell to change. FIG. 3B shows that there is a variation in voltage at node $N_{SEN}$ of the sense amplifier coupled to the metal bit line of memory cell G-cell (shown by timing diagram 306) that affects the sense node voltage for the sense amplifier coupled to the neighboring metal bit line of memory cell C-cell (shown by timing diagram 308) due to the coupling effect of the two neighboring metal bit lines. For example, as shown in timing diagram 306, the voltage level at node $N_{SEN}$ during the sensing operation fluctuates (e.g., the decrease in voltage at node $N_{SEN}$ does not have a straight line slope), with the voltage being at level V4 at time Tda. This variation in voltage causes a corresponding variation in the voltage level at node $N_{SEN}$ of the sense amplifier for the memory cell C-cell: as shown by timing diagram 308, the voltage level at node $N_{SEN}$ of the C-cell sense amplifier is also at level V4 at time Tda.

However, once the memory cell G-cell is programmed to its target voltage level, then the program verify cycles end, removing variations in the bias of the corresponding metal bit line. At this steady state, variations in the coupling effect of the neighboring metal bit lines are eliminated, such that there is also no fluctuation in the bias of the neighboring metal bit line coupled to memory cell C-cell. This is illustrated in FIG. 3C, which shows timing diagrams 310 and 312 for voltage levels in the sense amplifiers coupled to memory cells G-cell and C-cell respectively, after completion of a program operation of memory cell G-cell. As shown in timing diagram 310, the voltage level at node $N_{SEN}$ of the G-cell sense amplifier decreases steadily during the sensing operation, avoiding any fluctuation in the voltage level at node $N_{SEN}$ of the sense amplifier for the memory cell C-cell: as shown by timing diagram 312, the voltage level at node $N_{SEN}$ of the C-cell sense amplifier decreases steadily during the sensing operation for C-cell.

The following example quantifies the negative impact of the cross-coupling effect due to variation in the bias of the metal bit line. In some cases, the voltage V3 at node N3 is 0.2 volts (V) higher than the voltage V2 at node N2. When the voltage V3 is applied during the sensing period, the change in voltage at node $N_{COM}$ is accordingly 0.2V. The drain bias of the transistor M1 is thus higher by 0.2V, which causes 5 milli-volt (mV) variation in the bias at node $N_{BLI}$. The coupling ratio between neighboring metal bit lines can be about 0.8 due to a large value of the cross-coupling capacitance $C_{Couple}$ between the neighboring metal bit lines. In such cases, a 5 mV variation in the bias of neighboring metal bit lines (e.g., metal bit line coupled to memory cell G-cell) will cause a 4 mV bias variation (=5 mV*0.8) of a particular metal bit line (e.g., coupled to memory cell C-cell) during the sensing timing. The 4 mV variation in the metal bit line bias due to the cross-coupling capacitance will increase the metal bit line charging current ($I_{CH}$), which can be determined using equation (2):

$$\text{Capacitance*voltage=sensing current*sensing time} \qquad (2)$$

For example, if the sensing time is 750 nano-seconds (nS) and the cross-coupling capacitance is 2.5 pico-farads (pF), then the metal bit line pre-charging current due to a 4 mV change in the metal bit line voltage is $I_{CH}$=13.3 nano-amperes (nA), since 2.5 pF*4 mV=$I_{CH}$*750 nS using equation (2). If the reference sensing current of memory cell C-cell is 30 nA, then, after the program verify operation of memory cell G-cell, the sensing current of memory cell C-cell shifts to 43.3 nA, resulting in the cell current for C-cell being a low 69.3% of the sensing current. Accordingly, the threshold voltage for memory cell C-cell will change since higher sensing current is needed to access data from the cell.

The change in threshold voltage can be prevented by eliminating the variation in bias of a metal bit line during the sensing stage of program operations. Eliminating the variation in bias of the metal bit line will eliminate variations in the cross-coupling capacitance with neighboring metal bit lines, such that the sensing current for neighboring metal bit lines are not changed due to program verify cycles during program operations. FIGS. 4A-4B, 5A-5B and 6 illustrate examples of implementations that eliminate the variation in bias of a metal bit line during the sensing stage of program operations.

Figure 4A:
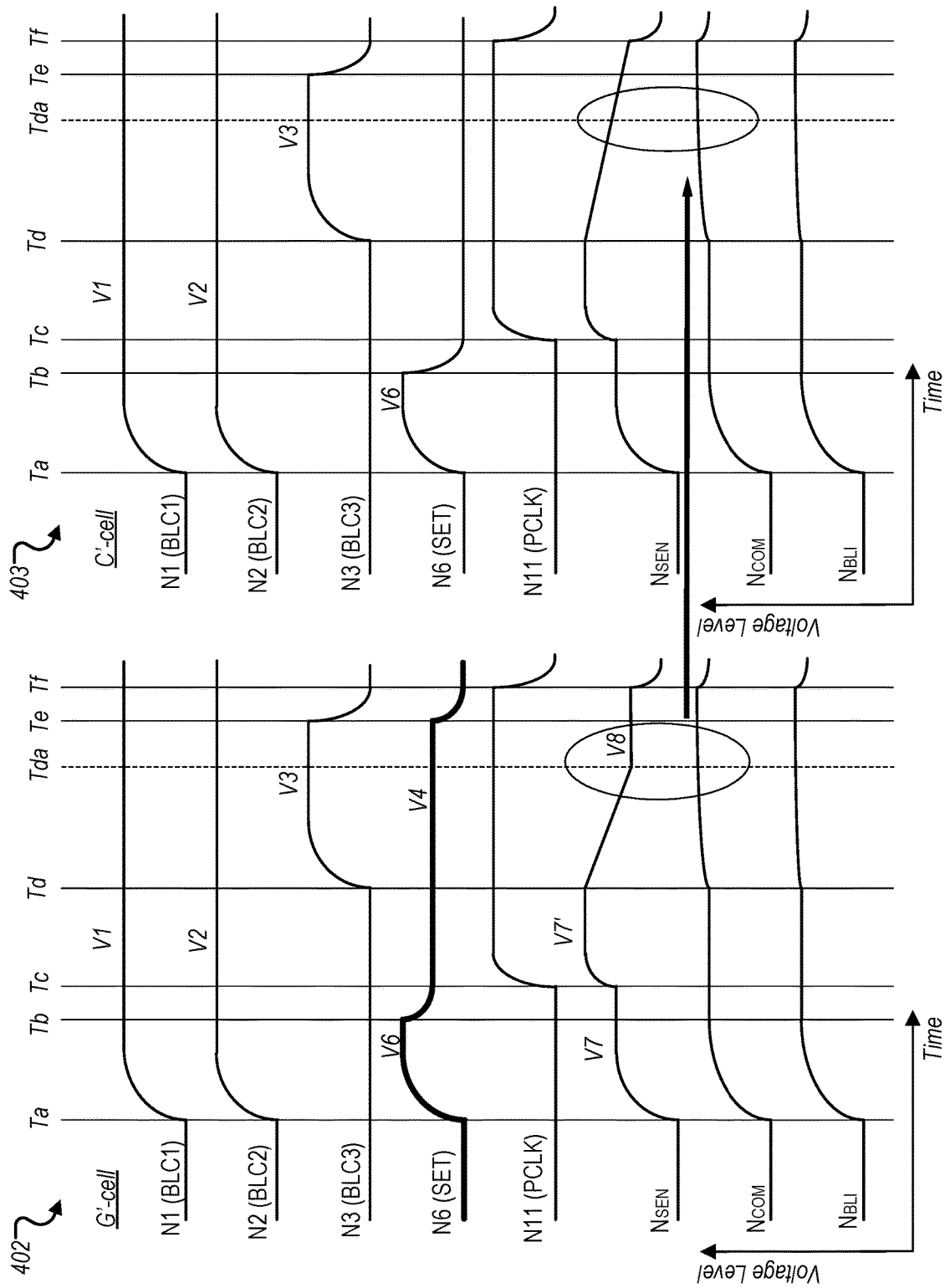
FIGS. 4A-4B illustrate example techniques to maintain the threshold voltage of a memory cell following a change in the array pattern of a memory cell array during program operations in a memory device.
Figure 4B:
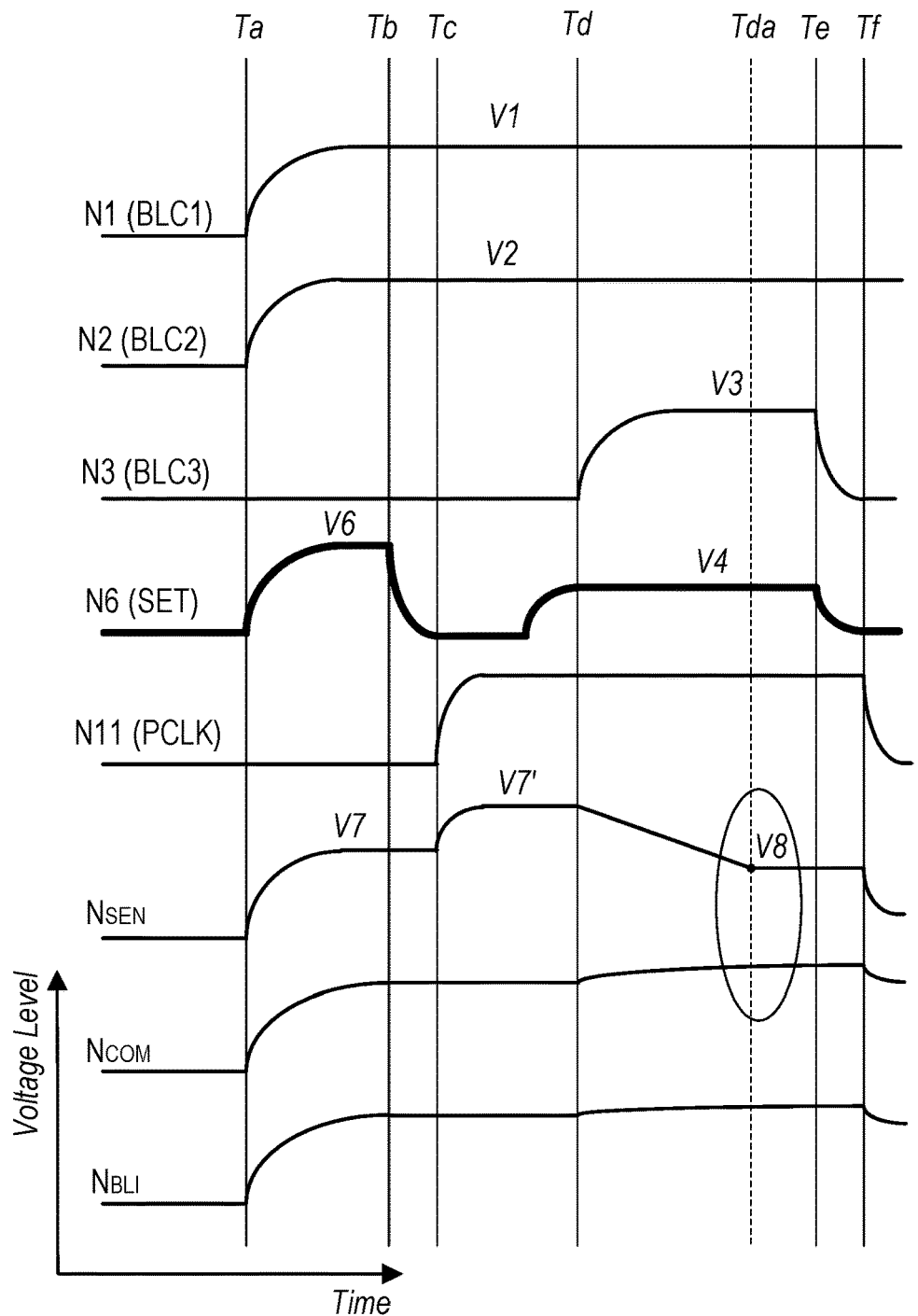

FIGS. 4A-4B illustrate example techniques to maintain the threshold voltage of a memory cell following a change in the array pattern of a memory cell array during program operations in a memory device. In some implementations, the techniques shown with reference to FIGS. 4A-4B are performed by a memory device with the circuit 200, e.g., memory device 100. FIGS. 4A and 4B show timing diagrams 402 and 404, respectively, used for pre-charging and sensing operations for a metal bit line in the memory cell array 204, e.g., metal bit line 210 using the sense amplifier 206 during a program operation for a memory cell in the cell string 212. In some implementations, the operations for controlling the sense amplifier 206 are performed by the memory controller 102. Accordingly, the timing diagrams 402 and 404 are described in the following sections with respect to memory controller 102.

The timing diagrams 402 and 404 each represents one access cycle for performing pre-charging and sensing operations for a sense amplifier to perform program verify operation of a memory cell in the memory cell array, e.g., sense amplifier 206 to program a memory cell in the cell string 212 coupled to metal bit line 210. The timings for the various stages of pre-charging and sensing in the timing diagrams 402 and 404 are similar to the timing described with reference to timing diagram 306, except for the differences noted below.

As shown in the timing diagram 402 of FIG. 4A, after pre-charging the sense node $N_{SEN}$ of the sense amplifier, e.g., sense amplifier 206, by setting signal SET such that the node N6 is charged to voltage level V6 at time Tb, the memory controller 102 allows the voltage at node N6 to decrease to a voltage level V4, and maintains the voltage level at V4 during the sensing stage by providing the SET signal at the lower voltage level, which maintains the bias at node $N_{SEN}$ to voltage level V4-Vgs(M4) during sensing. This is in contrast to conventional memory devices, in which the memory controller allows the voltage at node $N_{SEN}$ to decrease to 0V after time Tb, e.g., as shown with reference to timing diagram 306.

In some implementations, the value of voltage V4 is selected to maintain the bias at node $N_{SEN}$ to a lowest bias value that avoids any variation in the bias at node $N_{COM}$, e.g., by maintaining the bias at node $N_{COM}$ at voltage level V3-Vgs(M3). In some implementations, during the sensing stage, the voltage increase ΔV at node $N_{COM}$ is 0.2V when voltage V3 is applied at node N3, since V3-Vgs(M3) is greater than V2-Vgs(M2) by 0.2V. In such cases, the value of voltage V4 is set as: V4>V3+0.2V. The relationship between voltage levels V1, V2, V3 and V4 are accordingly given by equation (3):

$$V1 < V2 < V3 < V4 \quad (3)$$

$$\Delta V = 0.2\ V\ \Delta V = 0.2\ V\ \Delta V = 0.2\ V$$

In some implementations, value of V4 is selected to allow the bias at node $N_{COM}$ to vary within a known limited range of the voltage level V3-Vgs(M3). For example, in some cases, voltage V4 is set to a value such that the bias at node $N_{COM}$ varies within a range of 10 mV–15 mV of voltage level V3-Vgs(M3).

By maintaining the bias at node $N_{SEN}$ to a non-zero voltage level V4 during the sensing operation, the memory controller 102 ensures that the node $N_{COM}$ bias does not fluctuate due to program verify cycles, causing the bias at node NS to remain stable. Accordingly, the bias of the metal bit line 210 does not vary during the program verify cycles, such that the cross-coupling capacitance of metal bit line 210 with neighboring metal bit lines, e.g., metal bit line 214, does not change due to the program verify cycles while programming a memory cell coupled to metal bit line 210. By avoiding variation in the cross-coupling capacitance, bias variations for neighboring metal bit line 214 is avoided, resulting in the threshold voltage levels for memory cells coupled to metal bit line 214 remaining unaffected due to program operations for memory cells coupled to metal bit line 210.

The absence of the cross-coupling effect is illustrated by comparing the timing diagram 402 with the timing diagram 403 of a memory cell that is coupled to a neighboring metal bit line, as also illustrated in FIG. 4A. For example, as shown, the timing diagram 402 corresponds to a memory cell G'-cell that is coupled to metal bit line 210, while the timing diagram 403 corresponds to a memory cell C'-cell that is coupled to metal bit line 214. The two timing diagrams show that, by providing the nonzero voltage V4 to the node N6 during the sensing operation for memory cell G'-cell during program verify cycles, e.g., when G'-cell has not reached its target threshold voltage during a program operation, the coupling effect to neighboring memory cell C'-cell is avoided. As shown, during the sensing operation, the bias at node $N_{SEN}$ for the sense amplifier for G'-cell, e.g., sense amplifier 206, at time Tda is held at V8, which has no effect on the bias at node $N_{SEN}$ for the sense amplifier for C'-cell, e.g., sense amplifier 208, at time Tda. This can be contrasted with the timing diagrams 306 and 308 shown in FIG. 3B for a conventional memory device, where the variation in the bias at node $N_{SEN}$ at time Tda while programming memory cell G-cell (timing diagram 306) affects the bias of node $N_{SEN}$ for the sense amplifier for neighboring memory cell C-cell (timing diagram 308), as described previously.

The timing diagram 404 of FIG. 4B illustrates another implementation to keep the node N6 at a nonzero voltage during the sensing time period of program verify cycles of a program operation. As shown by timing diagram 404, in such implementations, after pre-charging the sense node $N_{SEN}$ of the sense amplifier, e.g., sense amplifier 206, by setting signal SET such that the node N6 is charged to voltage level V6 at time Tb, the memory controller 102 allows the voltage at node N6 to decrease to a zero voltage level after the time Tb. However, before the start of the sensing period at time Td, the memory controller provides another SET signal at the lower voltage level V4 to the node N6, and maintains the voltage level at V4 during the sensing stage. The discharge of the voltage at node $N_{SEN}$ during sensing occurs in a manner similar to that discussed with respect to FIG. 4A, and does not have a coupling effect on neighboring memory cells.

Figure 5A:
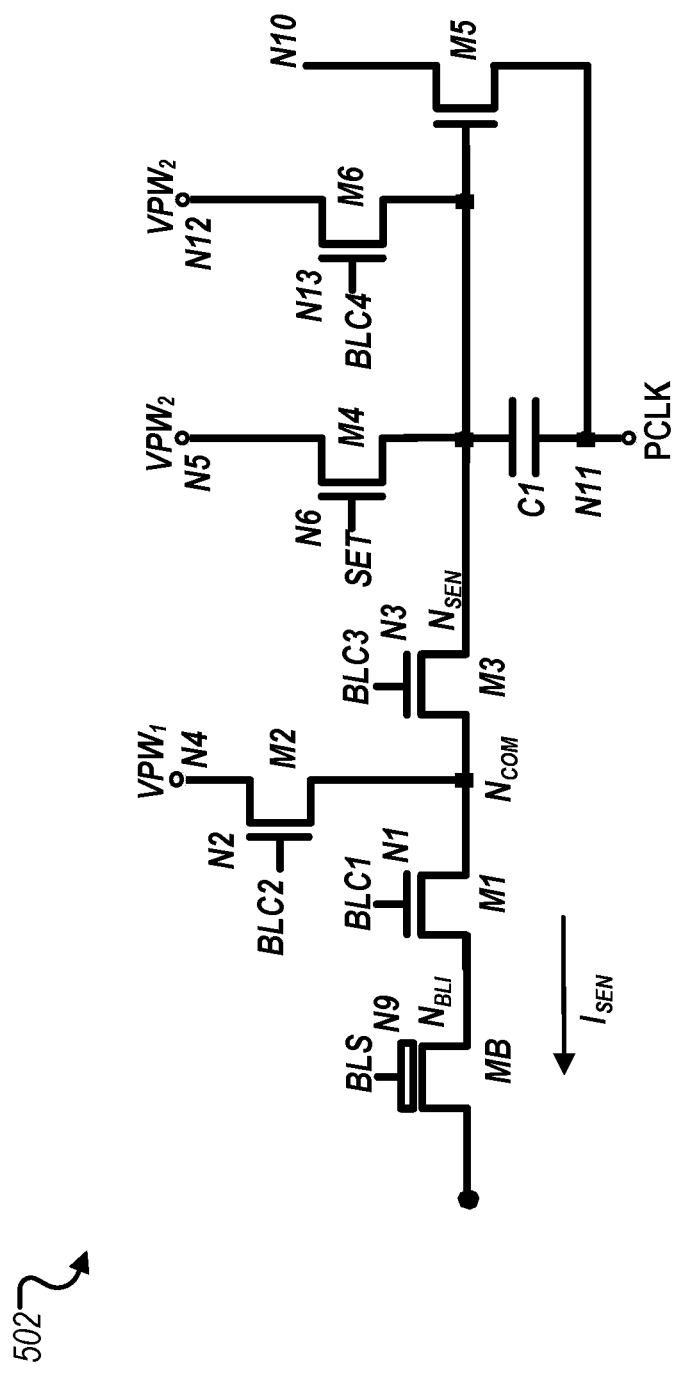
FIGS. 5A-5B illustrate an example of a sense amplifier circuit and corresponding timing diagram to maintain the threshold voltage of a memory cell following a change in the array pattern of a memory cell array during program operations in a memory device.
Figure 5B:
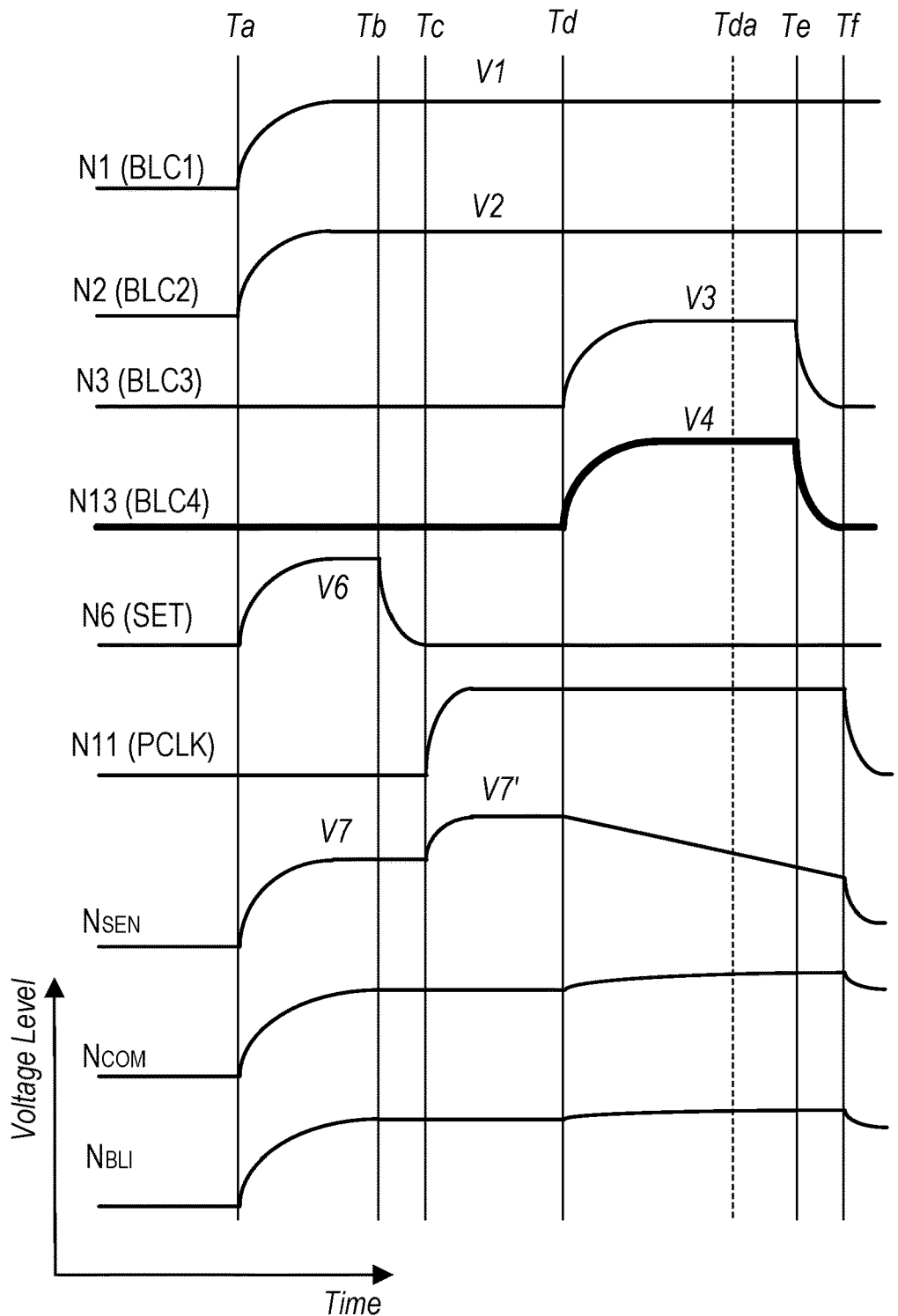

The timing diagrams 402 and 404 correspond to the sense amplifier 206. In some implementations, sense amplifiers with different circuit designs are used to achieve similar results, e.g., to prevent variation in memory cell threshold voltages due to array pattern changes of the memory cell array 204. FIGS. 5A-5B illustrate an example of a sense amplifier circuit 502 and corresponding timing diagram 504, respectively, to maintain the threshold voltage of a memory cell following a change in the array pattern of a memory cell array during program operations in a memory device. In some implementations, the sense amplifier circuit 502 of FIG. 5A is realized by a sense amplifier in the memory device 100. For example, in some cases, one or more sense amplifiers in the circuit 200, e.g., sense amplifier 208, have circuits similar to the circuit 502.

The sense amplifier circuit 502 is largely similar to the circuit of the sense amplifier 206. The difference between the two circuits is the addition of an additional transistor M6 to the sense amplifier circuit 502, which is used to provide the voltage V4 to bias the sense node $N_{SEN}$ during the sensing time period. As shown, a node N12 is coupled to the drain of the transistor M6, a node N13 is coupled to the gate of the transistor M6, and node $N_{SEN}$ is coupled to the source of the transistor M6. The voltage VPW2, which is similar to the voltage at node N5, is provided to the node N13. Where a signal at node N13 satisfies a threshold voltage of the transistor M6, the transistor M6 is turned on such that the voltage VPW2 is provided to the node $N_{SEN}$. This is performed by the memory controller during the sensing time period, as described below.

The timing diagram 504 of FIG. 5B illustrates the operation of the sense amplifier circuit 502 for pre-charging and sensing operations for a metal bit line in the memory cell array during a program operation for a memory cell in the cell string. In some implementations, the operations for controlling the sense amplifier circuit 502 are performed by the memory controller 102. Accordingly, the timing diagram 504 is described in the following sections with respect to memory controller 102 controlling the sense amplifier circuit 502. The timing diagram 504 represents one access cycle for performing pre-charging and sensing operations for the sense amplifier circuit 502 to perform program verify operation of a memory cell in the memory cell array, e.g., to program a memory cell in the cell string 216 coupled to metal bit line 216. The timings for the various stages of pre-charging and sensing in the timing diagram 504 are mostly similar to the timing described with reference to timing diagram 402, except for the differences noted below.

As shown in the timing diagram 504, after pre-charging the sense node $N_{SEN}$ of the sense amplifier by setting signal SET such that the node N6 is charged to voltage level V6 at time Tb, the memory controller 102 allows the voltage at node N6 to decrease to a default voltage level, e.g., 0V. However, at the start of the sensing period at time Td, the memory controller 106 biases the gate of the transistor M6 to the voltage level V4, which maintains the bias at node $N_{SEN}$ to voltage level V4-Vgs(M6) during sensing. The effect is similar to that achieved with respect to timing diagram 402 or 404, preventing a variation in the bias of the metal bit line during the program verify operations. The resulting effect is that bias variations for neighboring metal bit lines are avoided by avoiding variation in the cross-coupling capacitance, such that the threshold voltage levels for memory cells coupled to neighboring metal bit lines remain unaffected due to program operations performed using the sense amplifier circuit 502.

Figure 6:
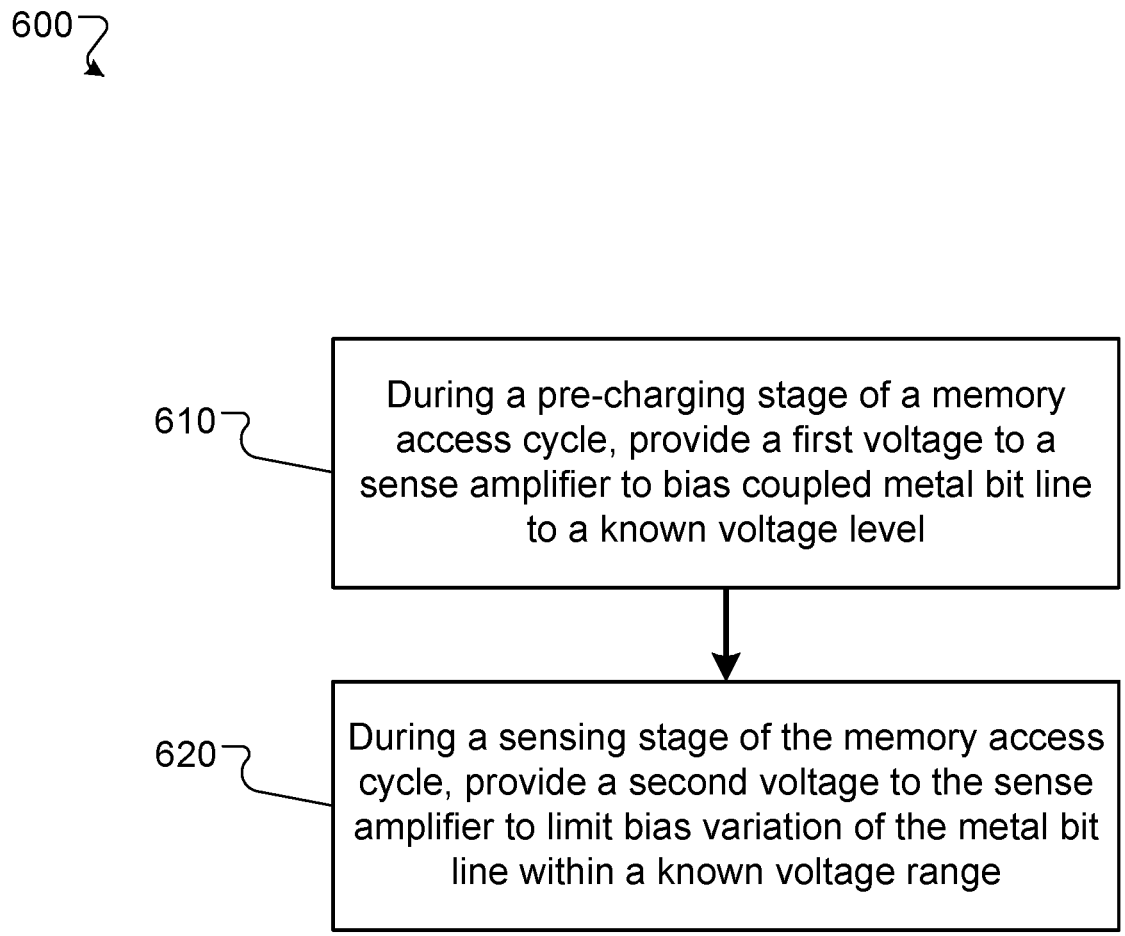
FIG. 6 illustrates an example process to perform pre-charging and sensing operations using a sense amplifier in a memory device.

FIG. 6 illustrates an example process 600 to perform pre-charging and sensing operations using a sense amplifier in a memory device. In some implementations, the process 600 is performed by a memory controller, e.g., memory controller 102, using the sense amplifier 206, to perform pre-charge and sense operations for memory cells coupled to a metal bit line in the memory cell array 204, e.g., metal bit line 210. Accordingly, the following sections describe the process 600 with respect to the memory controller 102 accessing memory cells coupled to the metal bit line 210 using the sense amplifier 206. In other implementations, the process 600 can be performed by other memory controllers or by using different sense amplifiers (e.g., sense amplifier circuit 502), or both.

In the process 600, during a pre-charging stage of a memory access cycle, the memory controller provides a first voltage to a sense amplifier to bias a coupled metal bit line to a known voltage level (610). For example, during a program verify cycle as part of a program operation of a memory cell in the cell string 212, the memory controller 102 provides a pre-charging voltage V6 (as shown in timing diagram 402) to the sense amplifier 206 between time Ta and time Tb, by providing the SET signal at the voltage level V6. In response to the pre-charging voltage V6, the node $N_{SEN}$ is biased to the voltage level V7.

During a sensing stage of the memory access cycle, the memory controller provides a second voltage to the sense amplifier to limit the bias variation of the metal bit line within a known voltage range (620). For example, after pre-charging the sense node $N_{SEN}$ of the sense amplifier 206 during the program verify cycle, the memory controller 102 provides a lower voltage level V4 to the node N6 after time Tb by providing the SET signal at the lower voltage level V4. The voltage at node N6 accordingly decreases from voltage V6 to voltage level V4, but stays at the non-zero voltage level V4 during the sensing stage, which maintains the bias at node $N_{SEN}$ to voltage level V4-Vgs(M4) during sensing. As discussed in previous sections, by providing the non-zero voltage level V4 to the sense amplifier 206 during the sensing time period, the memory controller 102 ensures that variations in the bias of the metal bit line 210 coupled to the sense amplifier 206 are avoided while performing program verify operations of a memory cell in the cell string 212.

The disclosed and other examples can be implemented as one or more computer program products, for example, one or more modules of computer program operations encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, an operating system, or a combination of one or more of them.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

While this document describes many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
    a memory cell array that includes a plurality of bit lines, wherein a bit line is coupled to a plurality of memory cells;
    a plurality of sense amplifiers, wherein a sense amplifier is coupled to a bit line and provides a sensing current to access data from one or more memory cells of the plurality of memory cells corresponding to the bit line; and
    a memory controller for controlling the plurality of sense amplifiers, the memory controller performing operations comprising:
        during a pre-charging stage of a memory access cycle, providing, to a particular sense amplifier, a first voltage; and
        during a sensing stage of the memory access cycle, providing, to the particular sense amplifier, a second voltage, wherein the second voltage is a non-zero voltage that is lower than the first voltage.

2. The memory device of claim 1, wherein the first voltage drives the sensing current to access data from a target memory cell.

3. The memory device of claim 2, wherein the sensing current includes (i) a first current provided to a plurality of memory cells coupled to a particular bit line that includes the target memory cell, and (ii) a second current provided to a capacitance circuit corresponding to the particular bit line.

4. The memory device of claim 3, wherein the particular sense amplifier includes:
    a sensing unit that generates the first current based on a first control signal received from the memory controller; and
    a pre-charging unit that generates the second current based on a second control signal and a third control signal that are received from the memory controller.

5. The memory device of claim 4, wherein the sensing unit includes:
    a first transistor that provides the first voltage upon application of the first control signal to a gate of the first transistor, and provides the second voltage upon application of a fourth control signal to the gate of the first transistor.

6. The memory device of claim 4, wherein the sensing unit includes:
    a first transistor that provides the first voltage upon application of the first control signal to a gate of the first transistor; and
    a second transistor that provides the second voltage upon application of a fourth control signal to a gate of the second transistor.

7. The memory device of claim 4, wherein the pre-charging unit includes:
    a first transistor that provides a third voltage upon application of the second control signal to a gate of the first transistor; and
    a second transistor that provides a fourth voltage upon application of the third control signal to a gate of the second transistor,
    wherein the second current is generated using the third voltage and the fourth voltage.

8. The memory device of claim 3, wherein the capacitance circuit includes a parasitic capacitance of the particular bit line and a cross-coupling capacitance shared between the particular bit line and an adjacent bit line.

9. The memory device of claim 1, wherein the particular sense amplifier provides the sensing current to a plurality of memory cells coupled to a particular bit line during a memory access cycle, and wherein the memory controller:
    provides the first voltage to the particular sense amplifier to bias the particular bit line to a known voltage level during the pre-charging stage, and
    provides the second voltage to the particular sense amplifier to limit a variation in the bias of the particular bit line within a known voltage range during the sensing stage.

10. The memory device of claim 9, wherein a value of the second voltage is selected to maintain the bias of a particular bit line coupled to the particular sense amplifier at a known voltage level.

11. A method for sensing a memory device, the method comprising:
    during a pre-charging stage of a memory access cycle, providing, by a memory controller to a particular sense amplifier of a plurality of sense amplifiers included in the memory device, a first voltage,
    wherein a sense amplifier of the plurality of sense amplifiers is coupled to a bit line of a plurality of bit lines included in the memory device and provides a sensing current to access data from one or more memory cells corresponding to the bit line; and
    during a sensing stage of the memory access cycle, providing, by the memory controller to the particular sense amplifier, a second voltage, wherein the second voltage is a non-zero voltage that is lower than the first voltage.

12. The method of claim 11, wherein providing the first voltage to the particular sense amplifier comprises driving the sensing current to access data from a target memory cell.

13. The method of claim 12, wherein the sensing current includes (i) a first current provided to a plurality of memory cells coupled to a particular bit line that includes the target memory cell, and (ii) a second current provided to a capacitance circuit corresponding to the particular bit line.

14. The method of claim 13, further comprising:
    generating, using a sensing unit included in the particular sense amplifier, the first current based on a first control signal received from the memory controller; and
    generating, using a pre-charging unit included in the particular sense amplifier, the second current based on a second control signal and a third control signal that are received from the memory controller.

15. The method of claim 14, further comprising:
    providing, using a first transistor included in the sensing unit, the first voltage upon application of the first control signal to a gate of the first transistor; and
    providing, using the first transistor, the second voltage upon application of a fourth control signal to the gate of the first transistor.

16. The method of claim 14, further comprising:
    providing, using a first transistor included in the sensing unit, the first voltage upon application of the first control signal to a gate of the first transistor; and
    providing, using a second transistor included in the sensing unit, second voltage upon application of a fourth control signal to a gate of the second transistor.

17. The method of claim 14, further comprising:
providing, using a first transistor included in the pre-charging unit, a third voltage upon application of the second control signal to a gate of the first transistor; and
providing, using a second transistor included in the pre-charging unit, a fourth voltage upon application of the third control signal to a gate of the second transistor,
wherein the second current is generated using the third voltage and the fourth voltage.

18. The method of claim 13, wherein the second current is provided to a parasitic capacitance of the particular bit line and a cross-coupling capacitance shared between the particular bit line and an adjacent bit line, wherein the parasitic capacitance and the cross-coupling capacitance are included in the capacitance circuit.

19. The method of claim 11, wherein the particular sense amplifier provides the sensing current to a plurality of memory cells coupled to a particular bit line during a memory access cycle, and wherein the method comprises:
providing, by the memory controller, the first voltage to the particular sense amplifier to bias the particular bit line to a known voltage level during the pre-charging stage; and
providing, by the memory controller, the second voltage to the particular sense amplifier to limit a variation in the bias of the particular bit line within a known voltage range during the sensing stage.

20. The method of claim 19, wherein providing the second voltage comprises:
selecting a value of the second voltage to maintain the bias of a particular bit line coupled to the particular sense amplifier at a known voltage level.

* * * * *